United States Patent
Ando et al.

(10) Patent No.: US 12,266,393 B2
(45) Date of Patent: Apr. 1, 2025

(54) NEGATIVE CAPACITANCE FOR FERROELECTRIC CAPACITIVE MEMORY CELL

(71) Applicant: INTERNATIONAL BUSINESS MACHINES CORPORATION, Armonk, NY (US)

(72) Inventors: Takashi Ando, Eastchester, NY (US); Reinaldo Vega, Mahopac, NY (US); David Wolpert, Poughkeepsie, NY (US); Nicholas Anthony Lanzillo, Wynantskill, NY (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 18/065,195

(22) Filed: Dec. 13, 2022

(65) Prior Publication Data
US 2024/0194236 A1   Jun. 13, 2024

(51) Int. Cl.
*G11C 11/22* (2006.01)
*H10B 53/30* (2023.01)
*H10D 1/68* (2025.01)

(52) U.S. Cl.
CPC ........ *G11C 11/221* (2013.01); *G11C 11/2273* (2013.01); *H10B 53/30* (2023.02); *H10D 1/694* (2025.01); *H10D 1/696* (2025.01)

(58) Field of Classification Search
CPC ... G11C 11/221; G11C 11/2273; H01L 28/65; H01L 28/75; H01L 28/40; H10B 53/30; H10D 1/694; H10D 1/696; A01K 67/364; A23B 11/164; H10H 20/814
See application file for complete search history.

(56) References Cited

U.S. PATENT DOCUMENTS

| | | | |
|---|---|---|---|
| 8,385,045 B2 | 2/2013 | Habu | |
| 9,679,893 B2 | 6/2017 | Yan | |
| 9,978,868 B2 | 5/2018 | Lai | |
| 10,600,808 B2 | 3/2020 | Schröder | |
| 11,043,276 B1 * | 6/2021 | Yadala | G11C 16/24 |
| 11,205,467 B2 * | 12/2021 | Slesazeck | G11C 11/2273 |
| 11,647,684 B2 | 5/2023 | Cohen | |
| 2002/0168785 A1 * | 11/2002 | Paz de Araujo | H10B 53/00 257/E21.208 |
| 2009/0262583 A1 | 10/2009 | Lue | |

(Continued)

FOREIGN PATENT DOCUMENTS

| | | |
|---|---|---|
| KR | 100328743 B1 | 6/1997 |
| KR | 102266538 B1 | 6/2021 |
| WO | 2020087393 A1 | 5/2020 |

OTHER PUBLICATIONS

Ando et al., "Multilayer Dielectric for Metal-Insulator-Metal Capacitor," U.S. Appl. No. 17/341,489, filed Jun. 8, 2021, 28 pages.

(Continued)

*Primary Examiner* — Allison Bernstein
(74) *Attorney, Agent, or Firm* — Jared C. Chaney

(57) ABSTRACT

A capacitive memory cell includes an electrode, a tunneling barrier layer in direct contact with the electrode, a charge trapping layer in direct contact with the tunneling barrier layer, a ferroelectric layer in direct contact with the charge trapping layer, and another electrode in direct contact with the ferroelectric layer.

20 Claims, 7 Drawing Sheets

(56) References Cited

U.S. PATENT DOCUMENTS

| | | |
|---|---|---|
| 2016/0308070 A1 | 10/2016 | Chang |
| 2021/0035990 A1* | 2/2021 | Lee ........................ H10B 43/35 |
| 2022/0149268 A1 | 5/2022 | Park |
| 2022/0302267 A1* | 9/2022 | Choe ..................... H01L 29/408 |
| 2022/0320428 A1 | 10/2022 | Cohen |

OTHER PUBLICATIONS

Luo, et al., "Experimental Demonstration of Non-volatile Capacitive Crossbar Array for In-memory Computing." Published in 2021 by IEEE. 4 pages. In 2021 IEEE International Electron Devices Meeting (IEDM), pp. 1-4, doi: 10.1109/IEDM19574.2021.9720508.
International Search Report and Written Opinion dated Jan. 31, 2024, for International Application No. PCT/CN2023/134198, filed Nov. 27, 2023.

\* cited by examiner

NEGATIVE CAPACITANCE FOR FERROELECTRIC CAPACITIVE MEMORY CELL

BACKGROUND

The present invention relates to computer memory, and more specifically, to ferroelectric capacitive memory devices.

Capacitive memory cells that incorporate ferroelectric material have been proposed to be used instead of other nonvolatile memory devices such as, for example, resistive random access memory (RRAM) and phase change memory (PCM). This is because RRAM and PCM cells rely on current flow to sense their states, whereas capacitive memory does not. Instead, the capacitive memory state is stored as an electrical capacitance at zero bias across the cell. Such capacitive memory cells can be useful for many applications, such as, for example, artificial intelligence and machine learning.

However, traditional capacitive memory cells rely on the hysteresis in a ferroelectric layer to create different states. When the capacitance versus voltage behavior of such capacitive memory cells is graphed, it creates what is known as a butterfly curve. Unfortunately, the butterfly curve is rather short, so the difference in capacitance between different hysteric voltage states is rather small. This limits the number of states that can be stored and limits the reliability of reading those states.

SUMMARY

According to one embodiment of the present disclosure, a capacitive memory cell includes an electrode, a tunneling barrier layer in direct contact with the electrode, a charge trapping layer in direct contact with the tunneling barrier layer, a ferroelectric layer in direct contact with the charge trapping layer, and another electrode in direct contact with the ferroelectric layer.

Because of the tunneling barrier layer and the charge trapping layer, electrical charge can be stored in the cell, which changes the capacitance of the cell. The altered capacitance can represent a state that persists after an electrical bias is removed. Thereby, the cell is a nonvolatile memory device. Furthermore, the tunneling barrier layer and the charge trapping layer allow for an increased capacitance difference to be present, which increases the operating window compared to a cell that only has a ferroelectric layer and relies on hysteresis. This provides more granularity in the states (e.g., more states than merely one and zero) and/or for more contrast between the states (e.g., more reliability in reading the states).

According to another embodiment of the present disclosure, an integrated circuit includes a charging transistor, a capacitive memory cell connected to the charging transistor, a discharging transistor connected to the capacitive memory cell, and a sensing component configured to measure a discharge of the capacitive memory cell. The capacitive memory cell includes an electrode, a tunneling barrier layer, a charge trapping layer, a ferroelectric layer, and another electrode.

Because of the tunneling barrier layer and the charge trapping layer, electrical charge can be stored in the cell, which changes the capacitance of the cell. The altered capacitance can represent a state that persists after an electrical bias is removed. Thereby, the cell is a nonvolatile memory device. Furthermore, the tunneling barrier layer and the charge trapping layer allow for an increased capacitance difference to be present, which increases the operating window compared to a cell that only has a ferroelectric layer and relies on hysteresis. This provides more granularity in the states (e.g., more states than merely one and zero) and/or for more contrast between the states (e.g., more reliability in reading the states).

In addition, because the integrated circuit measures the discharge of the cell, electrical current does not need to be pushed through the cell to sense its state. This reduces the power consumption of the integrated circuit, which can allow for more capacitive memory cells to be present in the integrated circuit than if resistive memory cells were used.

According to another embodiment of the present disclosure, a method of operating a capacitive memory cell includes applying an electrical bias to an electrode to cause electrons to migrate from another electrode, through a tunneling barrier layer, into a charge trapping layer. The method also includes removing the electrical bias to store a memory state and sensing the memory state with a sensing circuit.

Because of the tunneling barrier layer and the charge trapping layer, electrical charge can be stored in the cell, which changes the capacitance of the cell. The altered capacitance can represent a state that persists after an electrical bias is removed. Thereby, the cell is a nonvolatile memory device. Furthermore, the tunneling barrier layer and the charge trapping layer allow for an increased capacitance difference to be present, which increases the operating window compared to a cell that only has a ferroelectric layer and relies on hysteresis. This provides more granularity in the states (e.g., more states than merely one and zero) and/or for more contrast between the states (e.g., more reliability in reading the states).

DETAILED DESCRIPTION

Figure 1A:
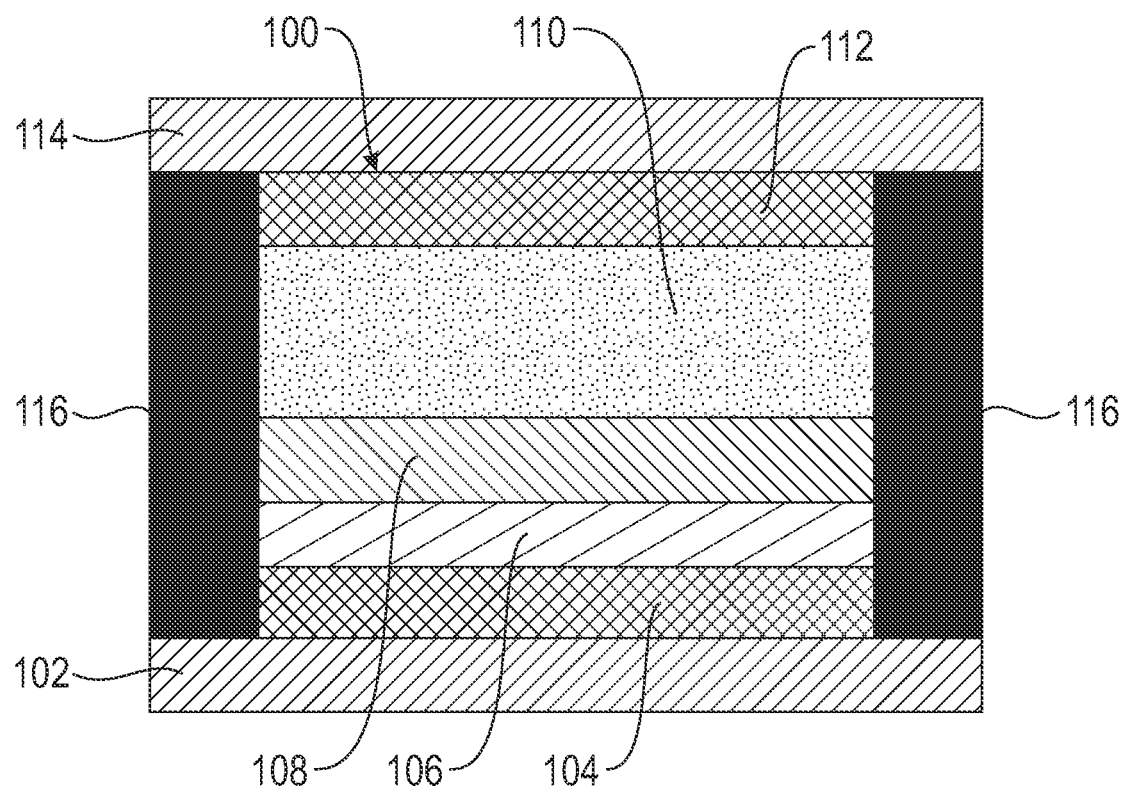
FIG. 1A is a cross-section view of a metal-ferroelectric-insulator-insulator-metal (MFIIM) capacitive memory cell, in accordance with an embodiment of the present disclosure.

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layers "C" and "D") are between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. In addition, any numerical ranges included herein are inclusive of their boundaries unless explicitly stated otherwise.

For purposes of the description hereinafter, the terms "upper," "lower," "right," "left," "vertical," "horizontal," "top," "bottom," and derivatives thereof shall relate to the described structures and methods, as oriented in the drawing Figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition can be any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching can be any process that removes material from the wafer. Examples include etch processes (either wet or dry), chemical mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping can be the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide ($SiO_2$), silicon nitride (SiN), etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography can be the formation of three-dimensional relief images or patterns on the semiconductor substrate for subsequent transfer of the pattern to the substrate. In semiconductor lithography, the patterns are formed by a light-sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators, and selectively doped regions are built up to form the final device.

FIG. 1A is a cross-section view of metal-ferroelectric-insulator-insulator-metal (MFIIM) capacitive memory cell 100 (hereinafter "cell 100"). In the illustrated embodiment, bottom wire 102 is connected to cell 100, which comprises bottom wire 102, bottom electrode 104, tunneling barrier layer 106, charge trapping layer 108, ferroelectric layer 110, and top electrode 112. Top wire 114 is also connected to cell 100, and insulator 116 surrounds cell 100 to electrically isolate it.

In the illustrated embodiment, the bottom of bottom electrode 104 is in direct contact with and electrically connected to the top of bottom wire 102, which can receive electrical signals from other components (shown in FIG. 5) of an IC. The bottom of tunneling barrier layer 106 is in direct contact with and electrically connected to the top of bottom electrode 104, and the bottom of charge trapping layer 108 is in direct contact with and electrically connected to the top of tunneling barrier layer 106. The bottom of ferroelectric layer 110 is in direct contact with and electrically connected to the top of charge trapping layer 108, and the bottom of top electrode 112 is in direct contact with and electrically connected to the top of ferroelectric layer 110. The bottom of top wire 114 is in direct contact with and electrically connected to the top of top electrode 112, and top wire 114 can deliver electrical signals from cell 100 to other components (shown in FIG. 9) of the IC.

In the illustrated embodiment, bottom electrode 104, tunneling barrier layer 106, charge trapping layer 108, ferroelectric layer 110, and top electrode 112 are all flat and have the same width (i.e., each of their widths are within 10% of the width of the adjacent layer). The thickness of tunneling barrier layer 106 can be between 1 nanometer (nm) and 3 nm, or about 2 nm. The thickness of charge trapping layer 108 can be between 1 nm and 5 nm, or about 3 nm. The thickness of ferroelectric layer 108 can be between 6 nm and 10 nm, or about 8 nm. However, the size and shape of bottom wire 102 (i.e., the electrically upstream contact) and/or top wire 114 (i.e., the electrically downstream contact) can be different from those of cell 100.

In the illustrated embodiment, bottom wire 102, bottom electrode 104, top electrode 112, and top wire 114 are comprised of a very electrically conductive material, such as metal or metallic compound, for example, titanium nitride (TiN), tantalum nitride (TaN), or tungsten (W). In the illustrated embodiment, insulator 116 is comprised of a dielectric (electrically insulating) material, such as, for example, silicon nitride (SiN), silicon oxide ($SiO_2$), silicon nitride carbide (SiNC), or tetraethyl orthosilicate (TEOS).

In the illustrated embodiment, tunneling barrier 106 is comprised of SiN and/or aluminum oxide (AO), and charge trapping layer 108 is comprised of tantalum oxide (TaO) and/or titanium oxide (TiO). Ferroelectric layer 110 comprises a doped hafnium oxide (HfO) material, and the dopant can be zirconium (Zr), silicon (Si), and/or aluminum (Al) to result in HfZrO, HfSiO, and HfAlO, respectively. Thereby, cell 100 has two non-ferroelectric layers (106, 108) in series with one ferroelectric layer (110) between electrodes 104 and 112. The paraelectric dielectric materials listed for tunneling barrier 106 and charge trapping layer 108, as well as the ferroelectric dielectric materials listed for ferroelectric layer 110, are exemplary and non-limiting. Therefore, other materials with the same basic characteristics can be substituted by a person having ordinary skill in the art.

Figure 1B:
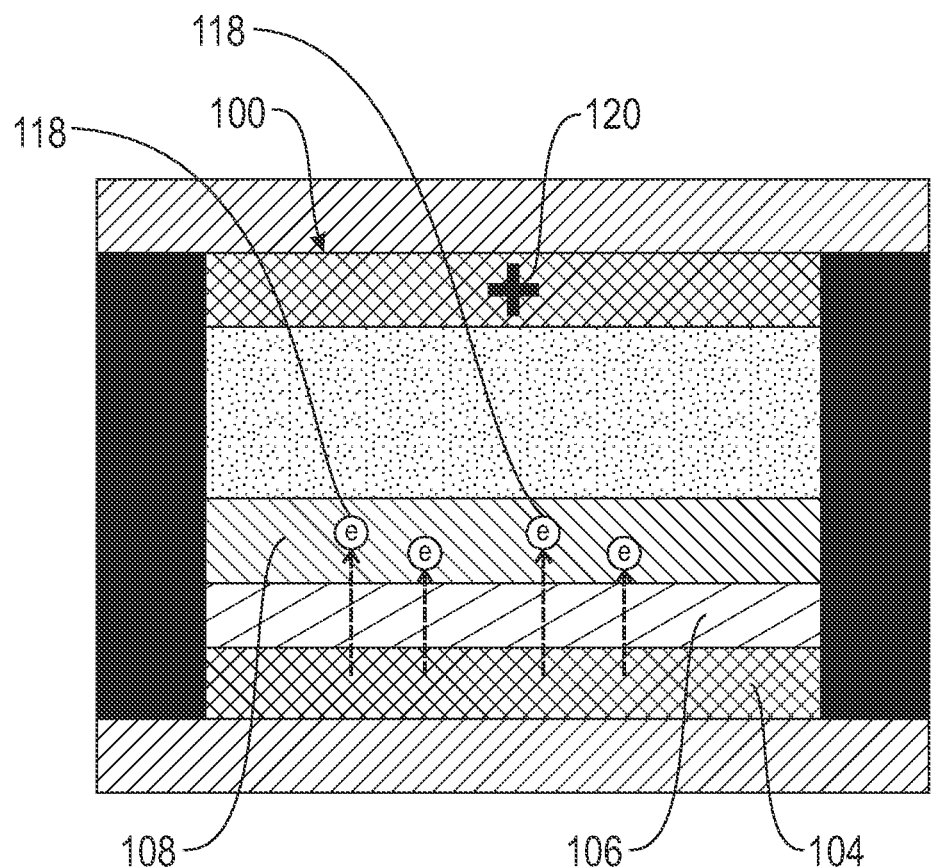
FIG. 1B is a cross-section view of the MFIIM cell of FIG. 1A including electrons, in accordance with an embodiment of the present disclosure.

FIG. 1B is a cross-section view of cell 100 including electrons 118. In the illustrated embodiment, positive electrical bias 120 has been applied to top electrode 112. Although in some embodiments, a negative electrical bias (not shown) is applied to the bottom electrode 112 alone or in combination with positive electrical bias 120.

In the illustrated embodiment, positive electrical bias 120 causes electrons 118 to migrate from bottom electrode 104, through tunneling barrier layer 106, and into charge trapping layer 108. Since charge trapping layer 108 will allow for electrons 118 to flow through itself at a voltage above a threshold level but will prevent electrons 118 from flowing through itself at a voltage below the threshold level, electrons 118 will remain in charge trapping layer 108 after positive electrical bias 120 is removed. Thereby, the memory state generated when positive electrical bias 130 was present has been stored using electrons 118. Because the memory state persists after positive electrical bias is removed, cell 100 is a nonvolatile memory device. While some of electrons 118 may be trapped in ferroelectric layer 110, electrons 118 are predominantly trapped in charge trapping layer 108 due to its higher trap density and shallower trap levels.

Figure 2B:
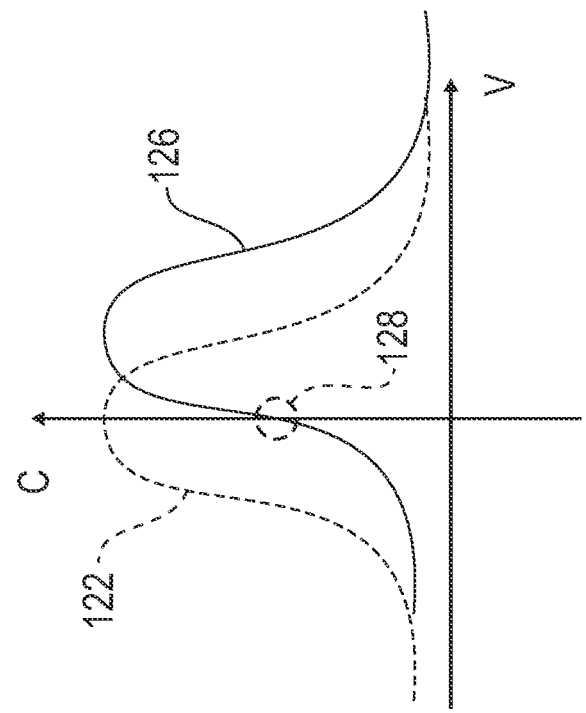
FIG. 2B is a graph of capacitance versus voltage for a charged MFIIM cell, in accordance with an embodiment of the present disclosure.
Figure 2A:
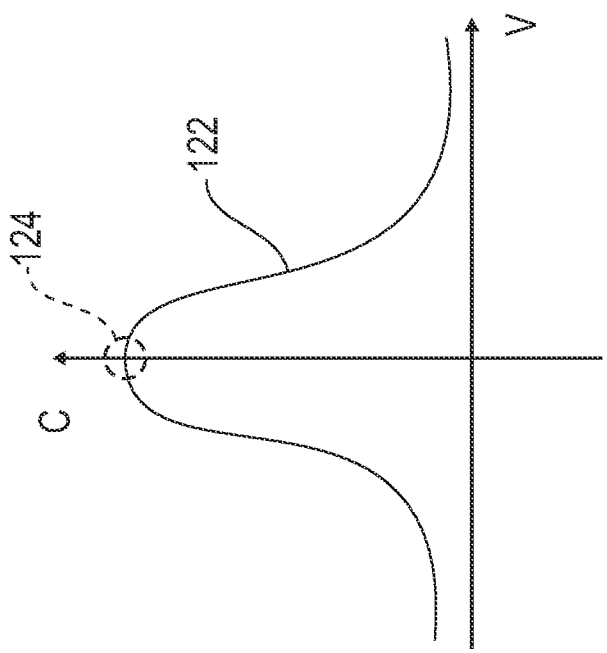
FIG. 2A is a graph of capacitance versus voltage for an uncharged MFIIM cell, in accordance with an embodiment of the present disclosure.

FIG. 2A is a graph of capacitance versus voltage for cell 100 in an uncharged state. Such a state of cell 100 is shown in FIG. 1A. In the illustrated embodiment, capacitance curve 122 at zero volts is indicated by circle 124. Generally, capacitance curve 122 is symmetric, and its peak is at zero volts. So, cell 100 has the highest capacitance at zero volts.

FIG. 2B is a graph of capacitance versus voltage for cell 100 in a charged state. Such a state of cell 100 is shown in FIG. 1B. In the illustrated embodiment, capacitance curve 126 has generally the same shape as capacitance curve 122, however, capacitance curve 126 is shifted to the right. Therefore, the capacitance of a charged cell 100 at zero volts (0V), as indicated by circle 128, is significantly lower than that of an uncharged cell 100 at 0V. Since the capacitance of cell 100 at 0V can be measured, the different values thereof can represent different memory states.

In the illustrated embodiment, the amount of the shift of capacitance curve 126 is proportional to the amount of trapped charge. Thereby, the capacitance of cell 100 at 0V can be controlled accordingly, so a memory state can be set.

For comparison, prior art capacitive memory cells (not shown) have used a metal-ferroelectric-metal (MFM) configuration. Their variance in capacitance at 0V occurred due to hysteresis, so the maximum variability of capacitance was comparatively low. In some prior art cells, the peak capacitance was only 1.2 times greater than the base capacitance. However, due to the implementation of tunneling barrier layer 106, charge trapping layer 108, and ferroelectric layer 110, the variability of capacitance at 0V can be significantly greater. In some embodiments, the peak capacitance is more than five times greater than the base capacitance. In some embodiments, the peak capacitance is about ten times greater than the base capacitance. This increase in the process window allows for more granularity in the states (e.g., more states than merely one and zero) and/or for more contrast between the states (e.g., more reliability in reading the states).

Figure 3B:
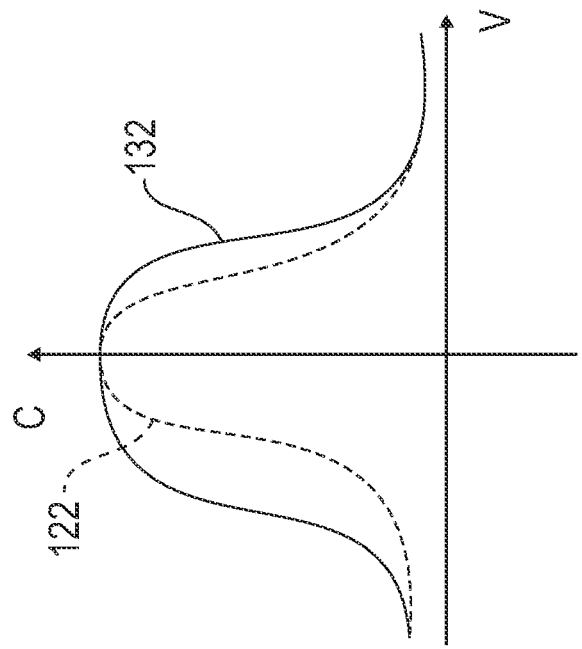
FIG. 3B is a graph of capacitance versus voltage for an MFIIM cell with an altered remnant polarization, in accordance with an embodiment of the present disclosure.
Figure 3A:
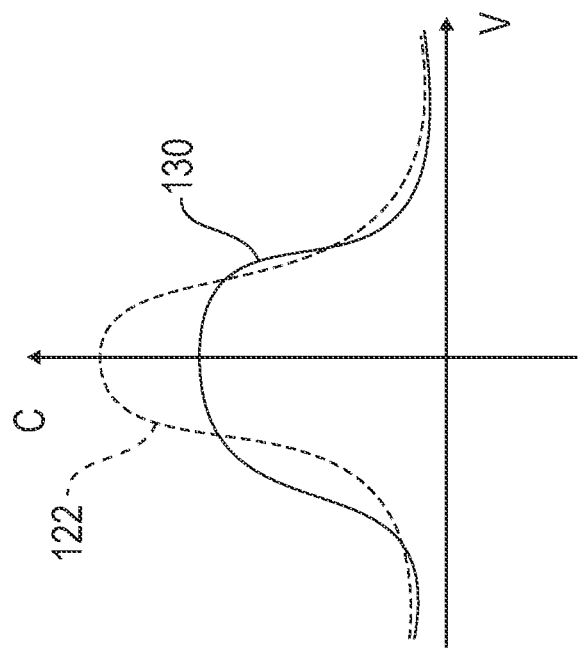
FIG. 3A is a graph of capacitance versus voltage for an MFIIM cell with an altered alpha value, in accordance with an embodiment of the present disclosure.
Figure 4:
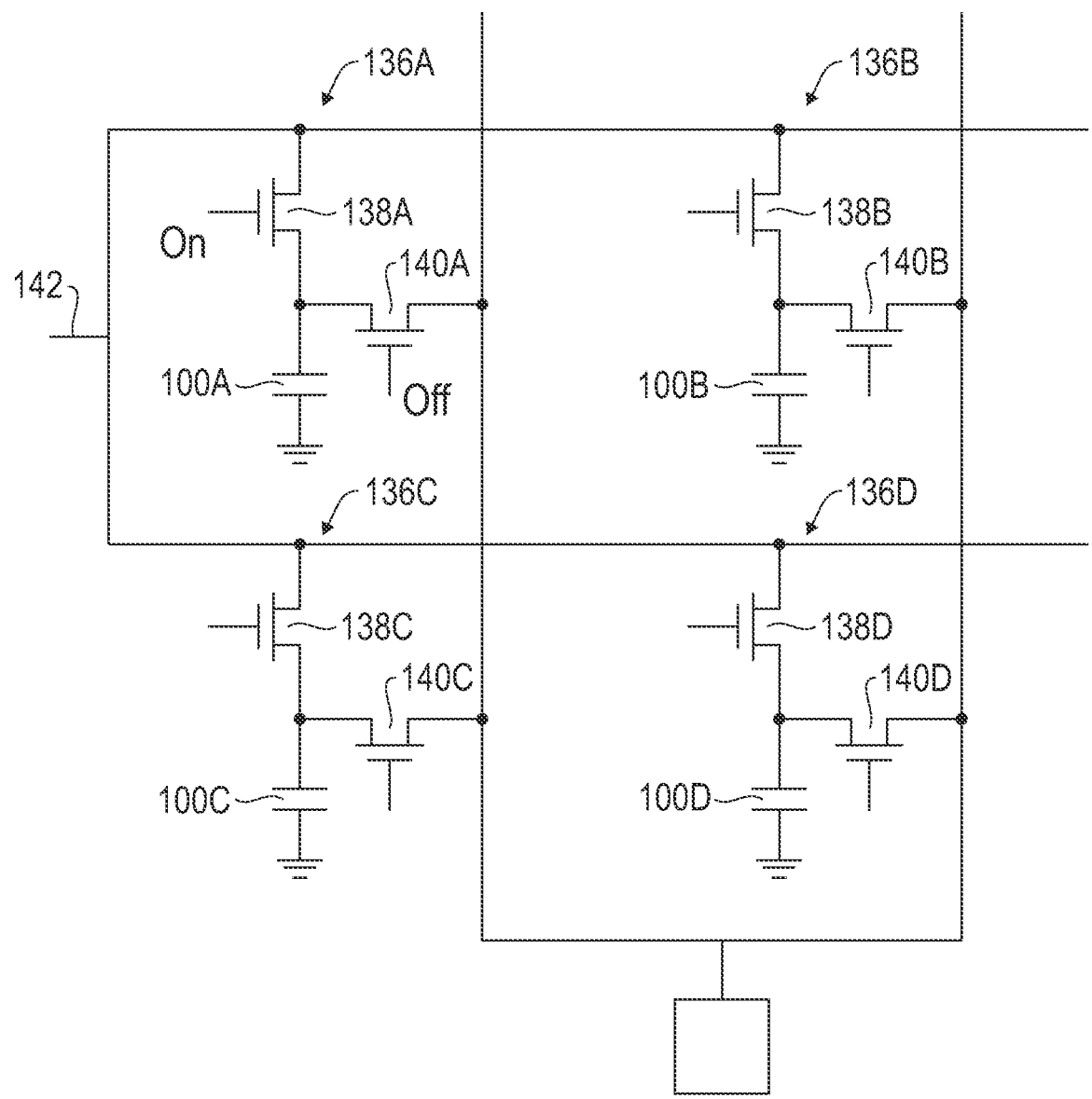
FIG. 4 is a circuit array diagram of a neural network during a charging phase, in accordance with an embodiment of the present disclosure.

FIG. 3A is a graph of capacitance versus voltage for an alternate embodiment MFIIM capacitive memory cell 100' (hereinafter "cell 100"). Cell 100' has different physical parameters from cell 100, so the capacitance of cell 100' is indicated by capacitance curve 130 (shown alongside capacitance curve 122 for reference). In the illustrated embodiment, cell 100' has a different alpha value for its ferroelectric layer 110'. The alpha value is a physical parameter in the Landau-Khalatnikov (LK) equation which indicates the relationship between an electric field and polarization charges per unit area. In some embodiments, the alpha value is between $-0.8 \times 10^{11}$ centimeters per farad (cm/F) and $-2.0 \times 10^{11}$ cm/F; in some embodiments, the alpha value is between $-1.2 \times 10^{11}$ cm/F and $-1.6 \times 10^{11}$ cm/F; and in some embodiments, the alpha value is between $-1.3 \times 10^{11}$ cm/F and $-1.5 \times 10^{11}$ cm/F.

Altering the alpha value primarily controls the height of the peak of capacitance curve 130. A lower peak typically yields shallower slopes going down from the peak. This allows for easier generation and detection of intermediate states between the peak and the base. However, a lower peak provides less contrast from the base capacitance, which can affect reliability and the number of intermediate states that can be detected.

FIG. 3B is a graph of capacitance versus voltage for an alternate embodiment MFIIM capacitive memory cell 100″ (hereinafter "cell 100″"). Cell 100″ has different physical parameters from cell 100, so the capacitance of cell 100″ is indicated by capacitance curve 132 (shown alongside capacitance curve 122 for reference). In the illustrated embodiment, cell 100″ has a different remnant polarization for its ferroelectric layer 110″. The remnant polarization depends on the amount of dopant is present in ferroelectric layer 110″. In some embodiments, the remnant polarization is between 1 microcoulombs per square centimeter ($\mu C/cm^2$) and 20 $\mu C/cm^2$; in some embodiments, the remnant polarization is between 2 $\mu C/cm^2$ and 16 $\mu C/cm^2$; and in some embodiments, the remnant polarization is between 5 $\mu C/cm^2$ and 10 $\mu C/cm^2$.

Altering the remnant polarization primarily controls the width of capacitance curve 132. A wider curve typically yields shallower slopes going down from the peak. This allows for easier generation and detection of intermediate states between the peak and the base. However, wider curve requires a higher operating voltage to shift the curve between states.

The opportunity to alter the physical characteristics of cell 100 (e.g., alpha value and remnant polarization) allow for cell 100 to be tuned for different applications. For example, cell 100 can be an efficient binary memory cell by having a tall, narrow capacitance curve. For another example, cell 100 can be a high-capacity memory cell by having a wide, gently sloping capacitance curve.

This memory state can then be sensed as a 0V capacitance. To do so, electrons 118 are transferred out of cell 100. This occurs by electrons 118 being detrapped from charge trapping layer 108, flowing through ferroelectric layer 110 and top electrode 112, and flowing into top wire 114.

Figure 5:
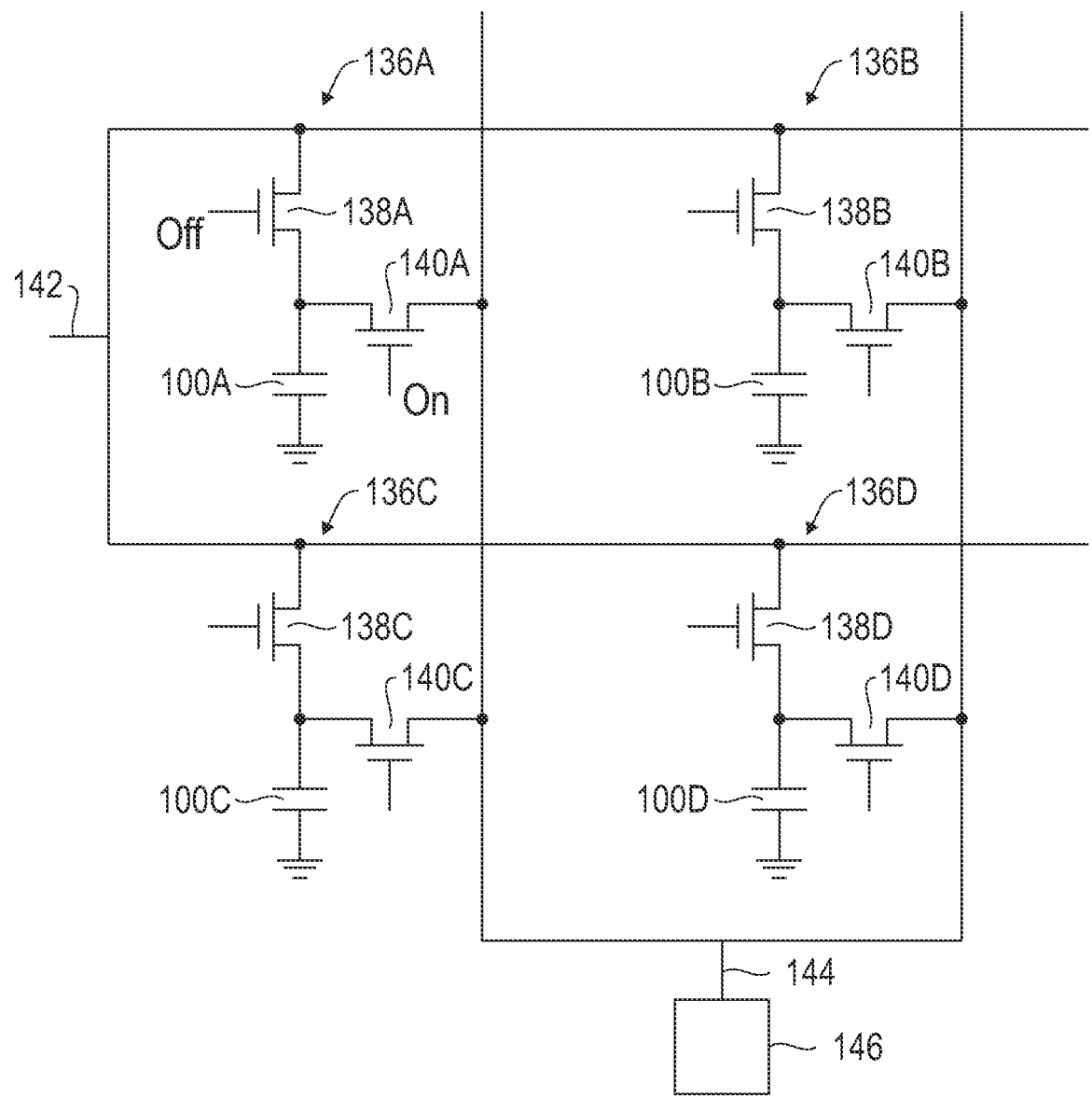
FIG. 5 is a circuit array diagram of a neural network during a discharging phase, in accordance with an embodiment of the present disclosure.

FIG. 5 is a circuit array diagram of neural network (NN) 134 during a charging phase. In the illustrated embodiment, NN 134 has a "cross point array" configuration and includes subcircuits 136A-136D (collectively "subcircuits 136"). Each subcircuit 136 includes a charging transistor 138A-138D (collectively "charging transistors 138"), a discharging transistor 140A-140D (collectively "discharging transistors 140"), and an MFIIM capacitive memory cell 100A-100D (collectively "cells 100"), respectively.

In the illustrated embodiment, charging transistors 138A-138D are connected to input line 142 at one end and to cells 100A-100D and discharging transistors 136A-136D at the other end, respectively. Using cell 100 as computer memory is accomplished in two phases, with the first (charging phase) being shown here. In this phase, a charging transistor 138 (e.g., 138A) is turned on to permit the flow of electrical current into a corresponding cell 100 (e.g., 100A). However, a corresponding discharging transistor 140 (e.g., 140A) is turned off, which prevents the flow of current from cell 100.

Figure 6:
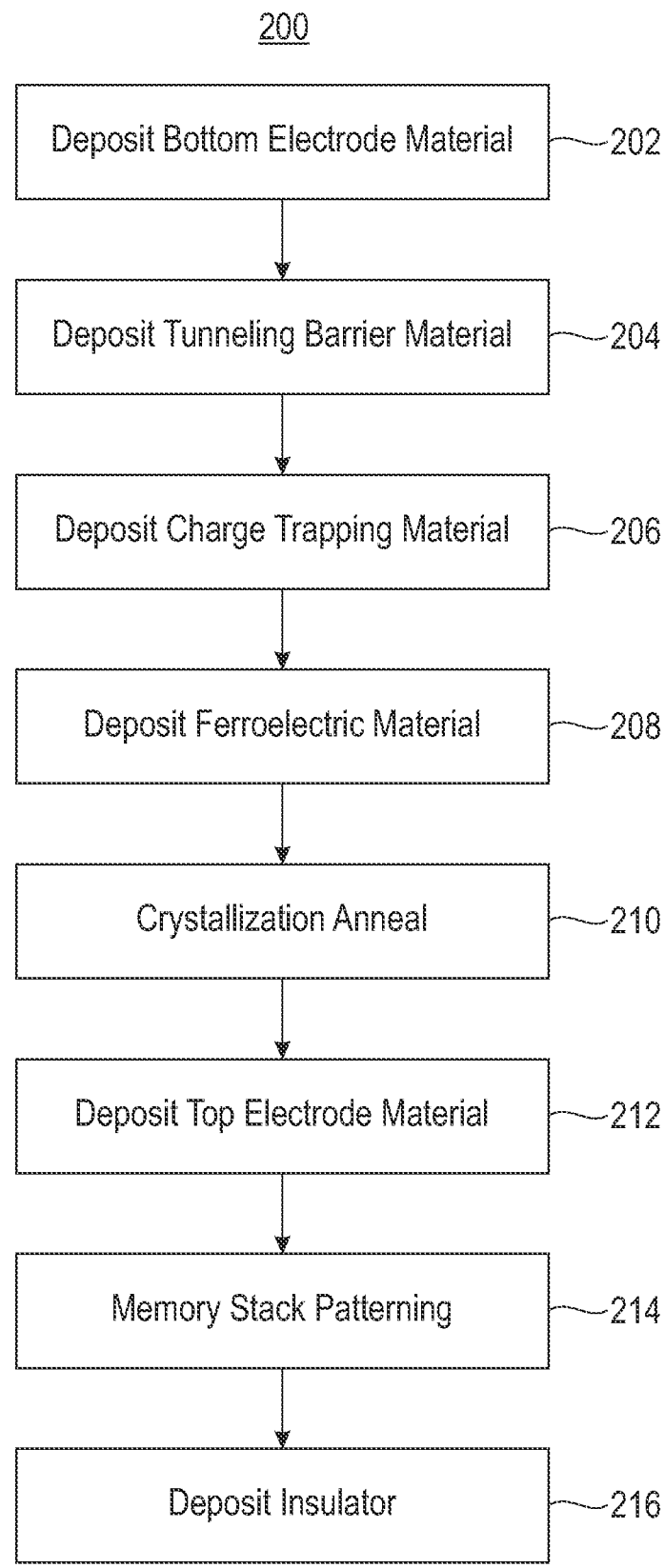
FIG. 6 is a flowchart of a method of manufacturing the MFIIM cell of FIG. 1A, in accordance with an embodiment of the present disclosure.

FIG. 6 is a circuit array diagram of neural network 134 during a second (discharging) phase. In the illustrated embodiment, a discharging transistor 140 (e.g., 140A) is energized to permit the flow of electrical current out of a corresponding cell 100 (e.g., 100A). However, a corresponding charging transistor 138 (e.g., 138A) is not energized, which prevents the flow of current into cell 100. The electrical charge of cell 100 then travels through output line 144 to sensing component 146. In some embodiments, sensing component 146 is a reference capacitor with a known capacitance. Then, a voltage reading across sensing component 146 can be sensed, for example, by a computer processor, which can reveal the state that cell 100 was in since the amount of charge stored in cell 100 will change the capacitance of sensing component 146 proportionately.

While each subcircuit 136 can be operated independently as separate memory cells, NN 134 can use multiple subcircuits 136 simultaneously. In such an embodiment, component 146 can be an integrator that can sense the electrical flow rate from cells 100 as they are discharged. Such an arrangement allows for computation of multiply and accumulate (MAC) operations.

Because the memory states in NN 134 are stored as capacitances, the power consumption required to sense them is significantly reduced compared to, for example, resistive memory cells. Thereby, NN 134 can be scaled up to larger array than would be possible with, for example, resistive memory.

FIG. 7 is a flowchart of a method 200 of manufacturing cell 100. In the illustrated embodiment, method 200 starts at operation 202 wherein electrode material is deposited on the wiring layer that includes bottom wire 102. At operation 204, tunneling barrier material is deposited on the electrode material. At operation 206, charge trapping material is deposited on tunneling barrier material. At operation 208, ferroelectric material is deposited on charge trapping material. At operation 210, the ferroelectric material is crystalized using an annealing process. At operation 212, electrode material is deposited on the ferroelectric material. At operation 214, the stack is patterned and etched to form cell 100. At operation 216, cell 100 is surrounded by depositing insulator material.

Discussion of Some Exemplary Embodiments

The following are non-exclusive descriptions of some exemplary embodiments of the present disclosure.

A capacitive memory cell, according to an exemplary embodiment of this disclosure, among other possible things, includes a first electrode; a tunneling barrier layer in direct contact with the first electrode; a charge trapping layer in direct contact with the tunneling barrier layer; a ferroelectric layer in direct contact with the charge trapping layer; and a second electrode in direct contact with the ferroelectric layer.

The capacitive memory cell of the preceding paragraph can optionally include, additionally and/or alternatively, any one or more of the following features, configurations, and/or additional components:

A further embodiment of the foregoing capacitive memory cell, wherein the tunneling barrier layer can comprise a silicon nitride material and/or an aluminum oxide material.

A further embodiment of any of the foregoing capacitive memory cells, wherein the charge trapping layer can comprise a tantalum oxide material and/or a titanium oxide material.

A further embodiment of any of the foregoing capacitive memory cells, wherein the ferroelectric layer can comprise a doped hafnium oxide material.

A further embodiment of any of the foregoing capacitive memory cells, wherein a dopant in the hafnium oxide material can comprise zirconium.

A further embodiment of any of the foregoing capacitive memory cells, wherein a dopant in the hafnium oxide material can comprise silicon.

A further embodiment of any of the foregoing capacitive memory cells, wherein a dopant in the hafnium oxide material can comprise aluminum.

A further embodiment of any of the foregoing capacitive memory cells, wherein the ferroelectric layer can be between 6 nanometers and 10 nanometers thick.

A further embodiment of any of the foregoing capacitive memory cells, wherein the charge trapping layer can be between 1 nanometer and 5 nanometers thick.

A further embodiment of any of the foregoing capacitive memory cells, wherein the tunneling barrier layer can be between 1 nanometer and 3 nanometers thick.

A further embodiment of any of the foregoing capacitive memory cells, wherein each of the first electrode, the tunneling barrier layer, the charge trapping layer, the ferroelectric layer, and the second electrode can be flat and can have the same width.

An integrated circuit, according to an exemplary embodiment of this disclosure, among other possible things, includes: a charging transistor; a capacitive memory cell connected to the charging transistor and comprising: a first electrode; a tunneling barrier layer; a charge trapping layer; a ferroelectric layer; and a second electrode; a discharging transistor connected to the capacitive memory cell; and a sensing component configured to measure a discharge of the capacitive memory cell.

The integrated circuit of the preceding paragraph can optionally include, additionally and/or alternatively, any one or more of the following features, configurations, and/or additional components:

A further embodiment of the foregoing integrated circuit, wherein: the tunneling barrier layer can be in direct contact with the first electrode; the charge trapping layer can be in direct contact with the tunneling barrier layer; the ferroelectric layer can be in direct contact with the charge trapping layer; and the second electrode can be in direct contact with the ferroelectric layer.

A further embodiment of any of the foregoing integrated circuits, wherein the tunneling barrier layer can comprise a silicon nitride material and/or an aluminum oxide material.

A further embodiment of any of the foregoing integrated circuits, wherein the charge trapping layer can comprise a tantalum oxide material and/or a titanium oxide material.

A further embodiment of any of the foregoing integrated circuits, wherein the ferroelectric layer can comprise a doped hafnium oxide material, wherein a dopant can be selected from the group consisting of: zirconium, silicon, and aluminum.

A further embodiment of any of the foregoing integrated circuits, wherein each of the first electrode, the tunneling barrier layer, the charge trapping layer, the ferroelectric layer, and the second electrode can be flat and can have the same width.

A method of operating a capacitive memory cell, according to an exemplary embodiment of this disclosure, among other possible things, includes: applying an electrical bias to a first electrode to cause electrons to migrate from a second electrode, through a tunneling barrier layer, into a charge trapping layer; removing the electrical bias to store a memory state; and sensing the memory state with a sensing circuit.

The method of the preceding paragraph can optionally include, additionally and/or alternatively, any one or more of the following features, configurations, and/or additional components:

A further embodiment of the foregoing method, wherein sensing the memory state can comprise: discharging the electrons into a reference capacitor in the sensing circuit; and measuring a voltage across the reference capacitor.

A further embodiment of any of the foregoing methods, wherein the electrical bias can be positive.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A capacitive memory cell comprising:
a first electrode;
a tunneling barrier layer in direct contact with the first electrode;
a charge trapping layer in direct contact with the tunneling barrier layer, wherein the tunneling barrier layer and the charge trapping layer are configured to store a charge and vary a capacitance of the memory cell;
a ferroelectric layer in direct contact with the charge trapping layer; and
a second electrode in direct contact with the ferroelectric layer.

2. The capacitive memory cell of claim 1, wherein the tunneling barrier layer comprises a silicon nitride material and/or an aluminum oxide material.

3. The capacitive memory cell of claim 1, wherein the charge trapping layer comprises a tantalum oxide material and/or a titanium oxide material.

4. The capacitive memory cell of claim 1, wherein the ferroelectric layer comprises a doped hafnium oxide material.

5. The capacitive memory cell of claim 4, wherein a dopant in the doped hafnium oxide material comprises zirconium.

6. The capacitive memory cell of claim 4, wherein a dopant in the doped hafnium oxide material comprises silicon.

7. The capacitive memory cell of claim 4, wherein a dopant in the hafnium oxide material comprises aluminum.

8. The capacitive memory cell of claim 1, wherein the ferroelectric layer is between 6 nanometers and 10 nanometers thick.

9. The capacitive memory cell of claim 1, wherein the charge trapping layer is between 1 nanometer and 5 nanometers thick.

10. The capacitive memory cell of claim 1, wherein the tunneling barrier layer is between 1 nanometer and 3 nanometers thick.

11. The capacitive memory cell of claim 1, wherein each of the first electrode, the tunneling barrier layer, the charge trapping layer, the ferroelectric layer, and the second electrode are flat and have a same width.

12. An integrated circuit comprising:
a charging transistor;
a capacitive memory cell connected to the charging transistor and comprising:
  a first electrode;
  a tunneling barrier layer;
  a charge trapping layer;
  a ferroelectric layer; and
  a second electrode;
a discharging transistor connected to the capacitive memory cell; and
a sensing component configured to measure a discharge of the capacitive memory cell.

13. The integrated circuit of claim 12, wherein:
the tunneling barrier layer is in direct contact with the first electrode;
the charge trapping layer is in direct contact with the tunneling barrier layer;
the ferroelectric layer is in direct contact with the charge trapping layer; and
the second electrode is in direct contact with the ferroelectric layer.

14. The integrated circuit of claim 12, wherein the tunneling barrier layer comprises a silicon nitride material and/or an aluminum oxide material.

15. The integrated circuit of claim 12, wherein the charge trapping layer comprises a tantalum oxide material and/or a titanium oxide material.

16. The integrated circuit of claim 12, wherein the ferroelectric layer comprises a doped hafnium oxide material, wherein a dopant is selected from the group consisting of: zirconium, silicon, and aluminum.

17. The integrated circuit of claim 12, wherein each of the first electrode, the tunneling barrier layer, the charge trapping layer, the ferroelectric layer, and the second electrode are flat and have a same width.

18. A method of operating a capacitive memory cell, the method comprising:
applying an electrical bias to a first electrode to cause electrons to migrate from a second electrode, through a tunneling barrier layer, into a charge trapping layer;
removing the electrical bias to store a memory state; and
sensing the memory state with a sensing circuit.

19. The method of claim 18, wherein sensing the memory state comprises:
discharging the electrons into a reference capacitor in the sensing circuit; and
measuring a voltage across the reference capacitor.

20. The method of claim 18, wherein the electrical bias is positive.

* * * * *